United States Patent [19]

Nanni et al.

[11] Patent Number: 5,487,183
[45] Date of Patent: Jan. 23, 1996

[54] METHOD AND APPARATUS FOR A DATA TRANSMITTER

[76] Inventors: Peter Nanni, 1210 Countryside Dr., Algonquin, Ill. 60102; Steven J. Fink, 3850 Winston Dr., Hoffman Estates, Ill. 60195; Jan P. Vanderspool, II, 8708 Bull Run Trail, Woodstock, Ill. 60098

[21] Appl. No.: 222,046

[22] Filed: Apr. 4, 1994

[51] Int. Cl.⁶ ............................................. H04B 1/04
[52] U.S. Cl. ...................... 455/113; 455/110; 455/115; 455/119
[58] Field of Search ..................... 455/42, 110, 112, 455/113, 119, 91, 264, 260, 115, 95, 114, 117, 118, 126; 332/126, 127, 128; 375/295, 302, 327

[56] References Cited

U.S. PATENT DOCUMENTS

| | | | |
|---|---|---|---|
| 4,242,649 | 12/1980 | Washborn, Jr. | 332/128 |
| 4,573,026 | 2/1986 | Curtis et al. | 332/128 |
| 4,707,670 | 11/1987 | Dakin | 455/113 |
| 4,864,257 | 9/1989 | Vandegraaf | 455/113 |
| 4,942,374 | 7/1990 | Sai | 332/128 |
| 5,193,103 | 3/1993 | Singh et al. | 332/127 |

Primary Examiner—Reinhard J. Eisenzopf
Assistant Examiner—Nguyen Vo
Attorney, Agent, or Firm—Christopher P. Moreno

[57] ABSTRACT

In a data transmitter (200), a precision timing signal receiver (201) provides a precise timing signal (203) to an informationally responsive comparator (205). The informationally responsive comparator compares an output (211) of a controllable oscillator (209) to the precise timing signal to produce a comparison metric. An output of the informationally responsive comparator, comprising a combination of an information signal (207) and the comparison metric, is then used to control the controllable oscillator.

14 Claims, 1 Drawing Sheet

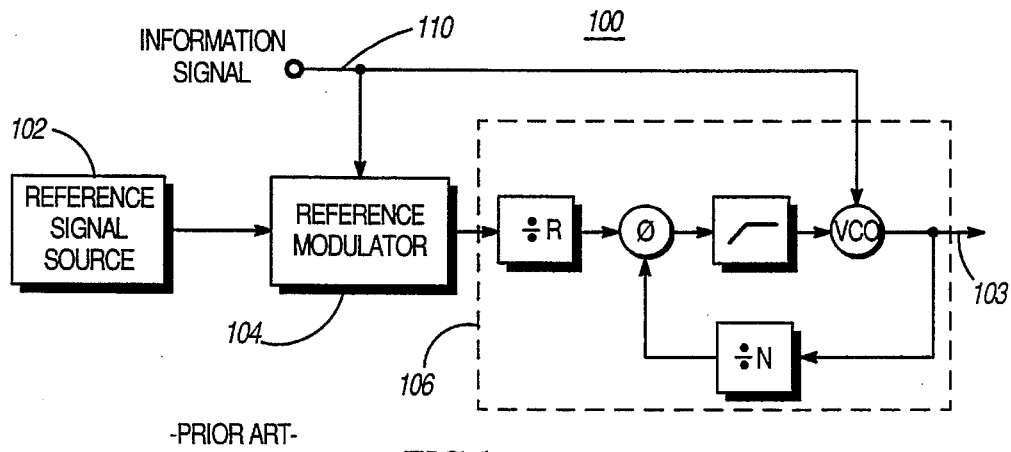
*FIG.1* -PRIOR ART-
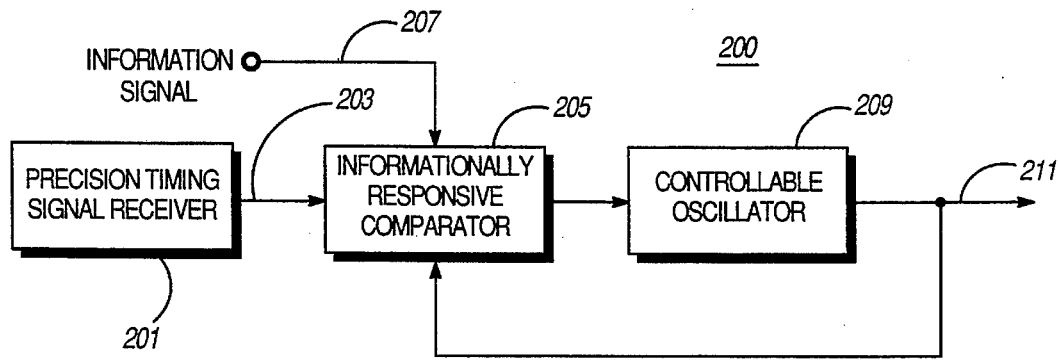
*FIG.2*
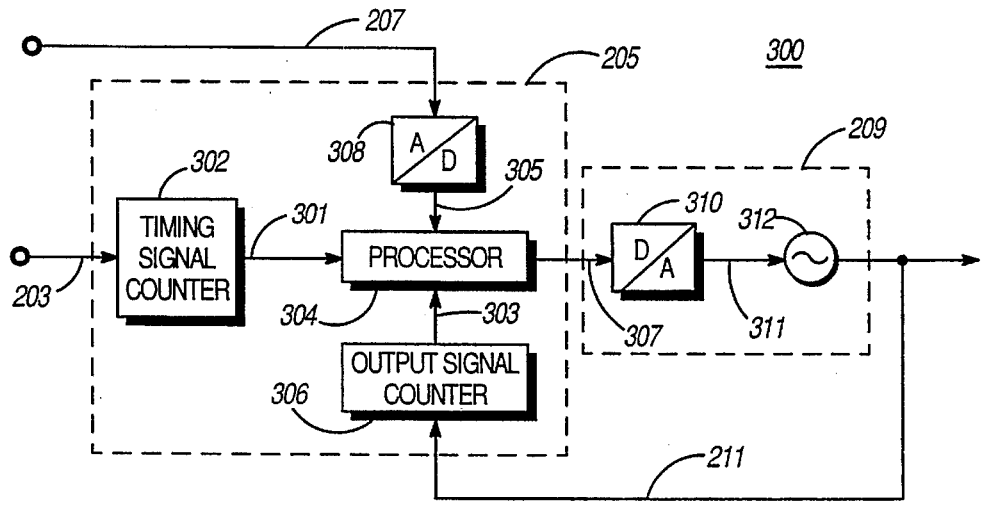
*FIG.3*

METHOD AND APPARATUS FOR A DATA TRANSMITTER

FIELD OF THE INVENTION

The present invention relates generally to communication devices and, in particular, to data transmitters.

BACKGROUND OF THE INVENTION

Communication devices are known to include data transmitters and receivers. Data transmitters typically operate by continuously modulating a characteristic (e.g., frequency, phase, or amplitude) of a communication medium. It is common in radio frequency (RF) based communication systems to utilize a frequency modulation (FM) technique to continuously modulate the frequency of a carrier signal. In such a scheme, deviation of the carrier signal about its center frequency is proportional to characteristics of an information signal, which information signal is representative of information intended for transmission. For example, the transitions between levels in a digital signal—e.g., ones and zeroes—can be used to cause the frequency of a carrier signal to variously shift above and below the center frequency of the carrier signal.

In practice, FM data transmitters often utilize phase locked loops (PLL's) to generate high-frequency carrier signals synchronized to a substantially lower frequency input reference signal. One problem with PLL's, inherent to their operation, is that they will follow slow variations (i.e., lower frequencies) of the reference signal, but will not follow fast variations (i.e., higher frequencies), such as noise jitter, in the reference signal. Stated another way, lower frequencies are filtered out of the carrier signal by the PLL, whereas the higher frequencies are not filtered out, thus modulating the carrier signal with undesired noise jitter. For this reason, it is important to use a highly stable reference signal as input to a PLL, since it is undesirable that a reference signal decrease the reliability of the data transmitter by causing modulation of the carrier signal.

Commensurate with the aforementioned filtering characteristic of PLL's, information signals used to modulate a PLL are subject to the same constraints as the reference signal; the high frequency content of the information signal applied to the data transmitter modulates the carrier signal, while the low frequency content is typically filtered out. While this lack of DC response (i.e., non-filtering of frequencies approaching 0 Hz) can be tolerated in some cases, there are communications systems, such as simulcast systems, that require DC response for proper operation of the data transmitters.

To provide DC response in data transmitters using PLL's, dual-port modulation can be used. FIG. 1 illustrates a dual-port data transmitter (100) in accordance with such prior art modulation techniques. The dual-port data transmitter (100) includes a reference signal source (102), a reference modulator (104), ant a PLL (106). The reference signal source (102) can be a temperature controlled crystal oscillator (TCXO) and the reference modulator (104) can also be a PLL.

In order to modulate a carrier signal (103) with a larger portion of the spectrum of an information signal (110)—i.e., provide DC response—the information signal (110) is simultaneously applied to the reference modulator (104) and a voltage controlled oscillator (VCO) within the PLL (106). In this manner, the high-pass filtering characteristics of the PLL (106) are mitigated since the low frequency content of the information signal (110) is "added" to the reference signal by the reference modulator (104).

While dual-port data transmitters achieve improved DC responses, they suffer from a variety of drawbacks. From a performance standpoint, any noise added to the reference signal by the reference modulator is magnified in the PLL by a factor of N/R, as exemplified in FIG. 1. Additionally, such data transmitters are not only subject to the various difficulties associated with PLL's (i.e., temperature drift of the VCO, thermal variation of the modulation sensitivity of the VCO, phase equalization of the two modulation ports, etc.), but they also incur the added cost, size, and complexity of the reference modulator Therefore, a need exists for a method and apparatus for modulating a carrier signal in a data transmitter that offers similar performance to existing techniques, and yet overcomes the higher cost and complexity of their implementations.

BRIEF DESCRIPTION OF THE DRAWINGS

FIG. 1 illustrates a block diagram of a data transmitter in accordance with prior art techniques.

FIG. 2 illustrates a block diagram of a data transmitter in accordance with :he present invention.

FIG. 3 illustrates a block diagram of an informationally responsive comparator and a controllable oscillator in accordance with a preferred embodiment of the present invention.

DESCRIPTION OF A PREFERRED EMBODIMENT

Generally, the present invention provides a method and apparatus for modulating a carrier signal with an information signal. This is accomplished using a controllable oscillator, nominally operating at a transmit frequency, to produce the carrier signal. An informationally responsive comparator is used to compare an output of the controllable oscillator with a precise timing signal to produce a comparison metric. The comparison metric is combined with the information signal, resulting in a control metric used to directly control the controllable oscillator. Such a method and apparatus provide an economical, simple technique for modulating a carrier signal with an information signal.

The present invention can be more fully described with reference to FIGS 2 and 3. FIG. 2 illustrates a block diagram of a data transmitter (200) that includes a precision timing signal receiver (201) an informationally responsive comparator (205), and a controllable oscillator (209). The informationally responsive comparator (205) takes as input a precise timing signal (203), an information signal (207), and an output signal (211) of the controllable oscillator.

The precision timing signal receiver (201) can be a GPS (Global Positioning Satellite) receiver, a land-based receiver such as a Loran-C receiver, or any precision time mark reference source. When the precision timing signal receiver (201) is a GPS receiver, the precise timing signal (203) would preferably be a highly accurate—on the order of 1 to 10 parts per billion-output of the GPS receiver having a predetermined period of 1 pulse per second.

The controllable oscillator (209) can be a voltage controlled oscillator (VCO) or its digital counterpart, commonly known as a numerically controlled oscillator (NCO). The frequency of an output signal of a VCO is proportional to its modulating input. That is, an analog modulating input having continuously variable amplitude and frequency will cause a VCO to produce a continuously variable output signal having an instantaneous frequency proportional to the modulating input. Correspondingly, the frequency of an output signal of an NCO is proportional to the most recent digital command input to the NCO. Thus, a continuous stream of modulating digital commands cause an NCO to produce a continuously variable output signal having an instantaneous frequency proportional to the stream of modulating digital commands. The output of the controllable oscillator (211), when operating in an "at rest" state (i.e., zero input voltage in the VCO case, or a non-modulating digital command in the NCO case) is the carrier signal, nominally centered at a transmit frequency, of the data transmitter (200).

In order to control the controllable oscillator (209), the informationally responsive comparator (205) compares the output of the controllable oscillator (211) and the precise timing signal (203) to produce a comparison metric. The comparison metric measures the difference between the actual frequency of the output of the controllable oscillator (211) and the transmit frequency. A control metric is produced by combining the comparison metric with the information signal (207). The control metric is in turn used to control the controllable oscillator (209). The present invention anticipates that the information signal (207) is either voice or data information intended to frequency modulate the carrier signal of the data transmitter (200). For example, voice information can be either an analog or digital representation of voice, and in the data case, the data can be a digital multilevel representation, e.g., 2-level, 4-level etc.

FIG. 3 illustrates a block diagram (300) of the informationally responsive comparator (205) operably coupled to a controllable oscillator (209) in accordance with a preferred embodiment of the invention. The informationally responsive comparator (205) includes a timing signal counter (302), a processor (304), an output signal counter (306), and an analog-to-digital (A/D) converter (308). The controllable oscillator (209) includes a digital-to-analog (D/A) converter (310) and a VCO (312).

As shown, it is assumed that the information signal (207) is an analog signal (e.g., voice information). The A/D converter (308) converts the information signal (207) into a digital information signal (305) compatible with the digital representations used by the processor (304). Ignoring for the moment other inputs to the processor (304), the digital information signal (305), after optional signal processing (e.g., filtering, delay offsetting, etc.), is used to produce a control metric (307). The control metric (307) is digitally represented and is converted, via the D/A converter (310), into an analog representation (311). The analog representation of the control metric (311) is then used to control the VCO (312). In this manner, the information signal (207) is allowed to modulate the output of the controllable oscillator (211). Those practiced in the art will appreciate that the formulation of the control metric (307) should take into account the modulation sensitivity of the VCO. For the purposes of illustration, it is hereafter assumed that a unit increase in the control metric (307) corresponds to a unit increase (i.e., +1 Hz) in the frequency of output of the controllable oscillator (211); a unit decrease in the control metric (307) corresponds to a unit decrease (i.e., −1 Hz) in the frequency.

As discussed previously, it is understood that the information signal (207) may also be a digitally represented signal. In such a case, the A/D converter (308) would not be necessary and could be replaced by a digital-to-digital format converter if, for example, the digital representation of the information signal (207) was not compatible with that of the processor (304). Of course, proper operation is not solely dependent upon the information signal (207). Proper operation of the controllable oscillator (209) is achieved through the use of other inputs to the processor (304). These other inputs also contribute to the formation of the control metric (307), as described hereinafter, and thus provide needed stability.

The timing signal counter (302), which may comprise a high-speed digital counter, monitors and counts cycles of the precise timing signal (203). For example, when the precision timing signal receiver (201) is a GPS receiver, the timing signal counter (302) will monitor and count the number of pulses occurring in the precise timing signal (203). Each time the timing signal counter (302) detects a cycle of the precise timing signal (203), an output (301) of the timing signal counter (302) signals or interrupts the processor (304).

Occurrence of the aforementioned interrupt causes the processor (304)—which may be a digital signal processor—to initiate a comparison routine. The comparison routine, stored in memory (not shown) of the processor (304), causes the processor (304) to determine an output signal metric (303) based on information from the output signal counter (306). To provide the output signal metric (303), the output signal counter (306) counts the number of cycles (e.g., by counting transitions or zero-crossings) of the output of the controllable oscillator (211) occurring within the predetermined period of the precise timing signal (203).

Once the output signal metric (303) is determined, a difference between the output signal metric (303) and an expected output signal metric can be computed. The expected output signal metric: acts as a reference point against which the actual frequency of the output of the controllable oscillator (211) is measured. For example, assuming that the output signal counter (306) counts half the total number of zero-crossings within the predetermined period (e.g., only those associated with falling edges), the expected output signal metric would be equivalent to the number of cycles one would ideally expect to occur during the predetermined period. Thus, the difference between the output signal metric (303) and the expected output signal metric indicates how far the actual frequency of the output of the controllable oscillator (211) has shifted from the transmit frequency. In the event that the actual frequency is identical to the transmit frequency, the difference would be zero.

Of course, non-zero differences reflect the fact that the actual frequency has drifted away from the transmit frequency. For instance, assume that the transmit frequency is 1 MHz, leading to an expected output signal metric, as defined above, of 1,000,000. Further assume that the predetermined period is 1 second and that the output signal metric has been measured, over a single predetermined period, to be 1,000,005. This leads to a difference of 5, which, if interpreted using the previously described conventions of the control metric (307), indicates that the actual frequency is 5 Hz too high. However, since the information signal (207) is used to modulate the frequency of the output of the controllable oscillator (211), as described above, the difference computed will reflect these intentional changes in the frequency.

To account for the intentional frequency changes introduced by the information signal (207), a cumulative information metric is computed. The cumulative information metric quantifies the cumulative effect of the digital information signal (305) on the frequency of the output of the controllable oscillator (211) during the predetermined period.

For example, assume that the digital information signal (305) during a single predetermined period comprises the binary string 0110111010. Further assume that the effect of a binary "1" in the digital information signal (305) on the output of the controllable oscillator (211) is an increase in frequency and is assigned a weight of +1. Conversely, assume that the effect of a binary "0" in the digital information signal (305) on the output of the controllable oscillator (211) is a decrease in frequency and is assigned a weight of −1. By summing up the effect, as represented by the ±1 weights of each binary element, the cumulative effect of the digital information signal (305) during the predetermined period can be measured. In the example given, six binary elements contribute +1, and four binary elements contribute −1, resulting in a cumulative information metric of +2. Thus, the cumulative information metric in this example indicates that the contribution of the information signal (207), during the predetermined period, to the frequency offset of the output (211) is +2. As before, how this translates into an actual frequency offset depends on the modulation sensitivity of the VCO (312). Additionally, it is recognized that binary words, as opposed to individual binary elements, could be used as described above.

Given the output signal metric, the expected output signal metric, and the cumulative information metric, a preferred embodiment of computing a control metric (CM) upon expiration of the predetermined period is to take the difference between the sum of the expected output signal metric (EOSM) and the cumulative information metric (CIM) and the output signal metric (OSM), as shown below:

$$CM=(EOSM+CIM)-OSM$$

Stated in this fashion, the sum of the expected output signal metric and the cumulative information metric represents an expected frequency indication and the output signal metric represents the actual frequency indication Accordingly, the difference between the two (i.e., the control metric) indicates how much correction is required to adjust the frequency back to the transmit frequency.

To illustrate this, numbers from the previous examples are used. Upon expiration of the 1-second predetermined period, the control metric is computed as: 1,000,000 (corresponding to the expected output signal metric) plus 2 (corresponding to the cumulative information metric) less 1,000,005 (corresponding to the output signal metric). This results in a control metric of −3, indicating that the frequency has drifted 3 Hz too high during the predetermined period. Thus, assuming the proper modulation sensitivity of the VCO, application of the control metric will cause the VCO to correct itself by 3 Hz. Operation will continue with subsequent control metrics being proportional to the information signal only, until the predetermined period once again expires. In this manner, the output of the controllable oscillator is continuously modulated and periodically corrected, based on the predetermined period. It is important to note that since the modulation sensitivity of a VCO is typically non-linear, it may be necessary to appropriately scale the control metric to compensate for these non-linearities.

As a result of the above, the frequency of a carrier signal being modulated by an information signal can be precisely maintained without elaborate circuitry common to transmitter synthesizer circuits, such as dual-port PLL's. By directly comparing the output of a controllable oscillator with a precise timing signal and compensating for the effects of an information signal, the present invention provides a method and apparatus for modulating a carrier signal with the information signal while maintaining accuracy of the carrier signal. With such a method, the problems traditionally associated with PLL synthesizers are substantially eliminated.

What is claimed is:

1. A data transmitter that includes a controllable oscillator operating nominally at a transmit frequency, an output of the controllable oscillator being modulated with an information signal, the data transmitter comprising:

means for receiving a precise timing signal, wherein the precise timing signal has a predetermined period;

converting means, arranged to receive the information signal, for converting the information signal into a digital information signal;

an output signal counter, arranged to receive the output of the controllable oscillator, for measuring transitions of the output of the controllable oscillator during the predetermined period to produce an output signal metric; and a processor, operably coupled to the means for receiving, the converting means, the output signal counter, and the controllable oscillator, for computing a cumulative information metric which measures a cumulative effect of the digital information signal on the output of the controllable oscillator during the predetermined period and for computing a control metric based on the output signal metric, the cumulative information metric, and an expected output signal metric, wherein the control metric is used to correct the output of the controllable oscillator.

2. The data transmitter of claim 1 wherein the means for receiving comprises a satellite-based receiver.

3. The data transmitter of claim 2 wherein the satellite receiver comprises a GPS (Global Positioning Satellite) receiver.

4. The data transmitter of claim 1 wherein the means for receiving comprises a land-based receiver.

5. The data transmitter of claim 4 wherein the land-based receiver comprises a Loran-C receiver.

6. The data transmitter of claim 1 wherein the controllable oscillator comprises a voltage controlled oscillator (VCO).

7. The data transmitter of claim 6 further comprising a second means for converting, operably coupled between the processor and the controllable oscillator, for converting the control metric into an analog signal.

8. The data transmitter of claim 1 wherein the controllable oscillator comprises a numerically controlled oscillator (NCO).

9. The data transmitter of claim 1, further comprising a timing signal counter, operably coupled between the means for receiving and the processor, for detecting cycles of the precise timing signal, wherein each cycle of the precise timing signal indicates the predetermined period.

10. In a data transmitter that includes a controllable oscillator operating nominally at a transmit frequency, an output of the controllable oscillator being modulated with an information signal, a method for adjusting the output of the controllable oscillator to operate at the transmit frequency, the method comprising the steps of:

A) receiving a precise timing signal, wherein the precise timing signal has a predetermined period;

B) converting the information signal into a digital representation to produce a digital information signal;

C) when the predetermined period has elapsed, computing a cumulative information metric, wherein the cumulative information metric measures a cumulative effect of the digital information signal on the output of the controllable oscillator during the predetermined period;

D) measuring transitions of the output of the controllable oscillator during the predetermined period to produce an output signal metric;

E) when the predetermined period has elapsed, computing a control metric based on the output signal metric, the cumulative information metric, and an expected output signal metric, wherein the expected output signal metric is derived from the transmit frequency; and F) when the predetermined period has elapsed, using the control metric to correct the output of the controllable oscillator.

11. The method of claim 10, wherein step (C) further comprises the step of assigning weights to each sample of the digital information signal.

12. The method of claim 11, wherein step (C) further comprises the step of computing the cumulative information metric by summing the weights assigned to each sample of the digital information signal.

13. The method of claim 10, wherein step (D) further comprises the step of computing the control metric, wherein the control metric is equal to the sum of the expected output signal metric and the cumulative information metric less the output signal metric.

14. The method of claim 10, wherein the controllable oscillator is a voltage controlled oscillator (VCO), and wherein step (F) further comprises the step of converting the control metric into an analog format.

* * * * *